United States Patent
Moriizumi

(10) Patent No.: US 7,222,420 B2
(45) Date of Patent: May 29, 2007

(54) METHOD FOR MAKING A FRONT AND BACK CONDUCTIVE SUBSTRATE

(75) Inventor: Kiyokazu Moriizumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 269 days.

(21) Appl. No.: 10/801,541

(22) Filed: Mar. 17, 2004

(65) Prior Publication Data

US 2004/0173890 A1    Sep. 9, 2004

Related U.S. Application Data

(62) Division of application No. 09/783,598, filed on Feb. 15, 2001.

(30) Foreign Application Priority Data

Jul. 27, 2000    (JP) ............................. 2000-226269

(51) Int. Cl.
    H05K 3/36    (2006.01)
(52) U.S. Cl. ............................. 29/830; 29/846; 29/852; 29/874; 29/884; 438/612; 438/616
(58) Field of Classification Search .......... 29/830–836, 29/883–884, 874, 846, 825; 174/260–264, 174/252, 254; 361/792, 798; 257/774; 216/27, 216/41; 438/734, 750, 3, 704
    See application file for complete search history.

(56) References Cited

U.S. PATENT DOCUMENTS

| | | | |
|---|---|---|---|
| 3,571,923 A | 3/1971 | Shaheen | |
| 4,706,167 A | 11/1987 | Sullivan | |
| 5,135,606 A | 8/1992 | Kato et al. | |
| 5,286,926 A | 2/1994 | Kimura et al. | |
| 5,319,159 A | 6/1994 | Watanabe et al. | |
| 5,331,514 A | 7/1994 | Kuroda | |
| 5,454,161 A | 10/1995 | Beilin et al. | |
| 5,459,096 A * | 10/1995 | Venkatesan et al. | ........ 438/437 |
| 5,459,368 A | 10/1995 | Onishi et al. | |
| 5,473,120 A | 12/1995 | Ito et al. | |
| 5,541,368 A | 7/1996 | Swamy | |
| 5,585,138 A | 12/1996 | Inasaka | |
| 5,679,213 A * | 10/1997 | Noshiro | ...................... 438/669 |
| 5,883,335 A | 3/1999 | Mizumoto et al. | |
| 5,897,360 A * | 4/1999 | Kawaguchi | .................. 438/431 |

(Continued)

FOREIGN PATENT DOCUMENTS

DE    3939647    5/1990

(Continued)

OTHER PUBLICATIONS

Communication from the European Patent Office dated May 13, 2004 in Application No. EP 01 30 1243.

*Primary Examiner*—Minh Trinh
(74) *Attorney, Agent, or Firm*—Westerman, Hattori, Daniels & Adrian, LLP.

(57) ABSTRACT

A front-and-back electrically conductive substrate includes a plurality of posts composed of a material that can be anisotropically etched and having an electrically conductive portion that has at least a first surface and a second surface that communicate with each other, and an insulative substrate that supports the plurality of posts.

4 Claims, 16 Drawing Sheets

U.S. PATENT DOCUMENTS

| | | | |
|---|---|---|---|
| 5,987,744 A | 11/1999 | Lan et al. | |
| 6,028,364 A | 2/2000 | Ogino et al. | |
| 6,036,566 A | 3/2000 | Baldi et al. | |
| 6,096,656 A | 8/2000 | Matzke et al. | |
| 6,199,273 B1 | 3/2001 | Kubo et al. | |
| 6,207,259 B1 | 3/2001 | Iino et al. | |
| 6,242,078 B1 | 6/2001 | Pommer et al. | |
| 6,245,996 B1 | 6/2001 | Atakov et al. | |
| 6,258,286 B1 | 7/2001 | Hawkins et al. | |
| 6,323,132 B1 * | 11/2001 | Hwang et al. | 438/706 |
| 6,333,252 B1 * | 12/2001 | Jung et al. | 438/612 |
| 6,465,950 B1 | 10/2002 | Baldi et al. | |
| 6,706,547 B2 * | 3/2004 | Sakamoto et al. | 438/33 |
| 6,733,681 B1 * | 5/2004 | Hipwell et al. | 216/2 |
| 7,096,578 B2 * | 8/2006 | Iijima et al. | 29/830 |
| 7,140,101 B2 * | 11/2006 | Cheng et al. | 29/830 |

FOREIGN PATENT DOCUMENTS

| | | |
|---|---|---|
| JP | 10-027825 | 1/1998 |
| JP | 10-223833 | 8/1998 |
| JP | 11-163207 | 6/1999 |
| WO | WO 96/19829 | 6/1996 |

* cited by examiner

FIG. 1
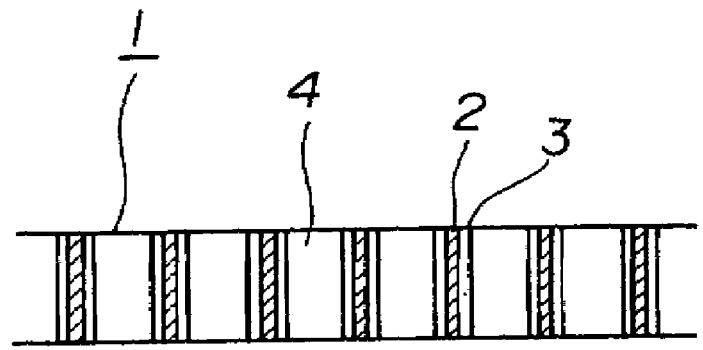
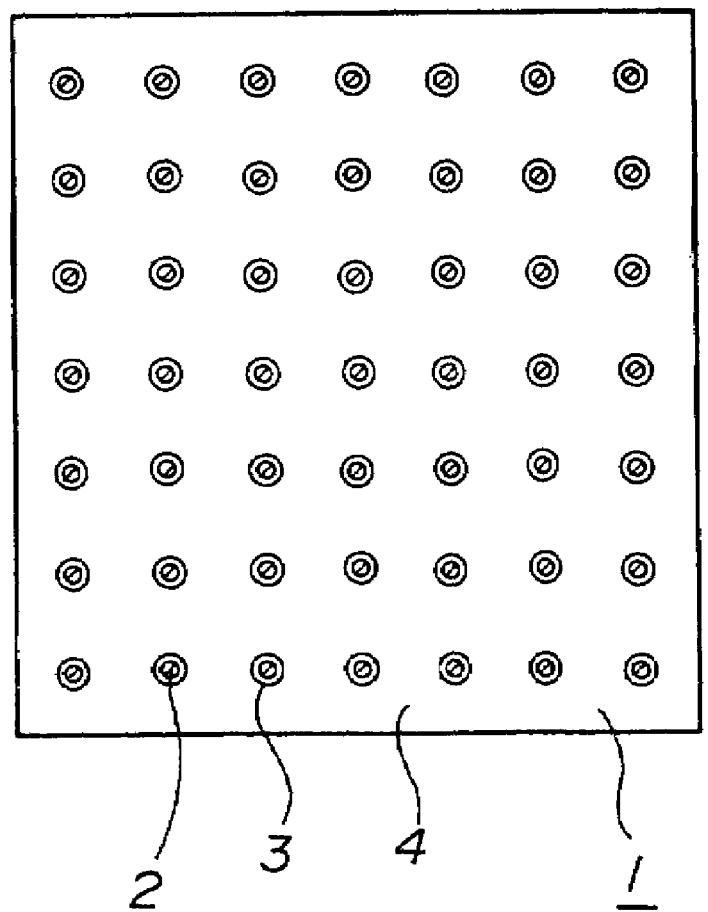

FIG. 6
(A-1)
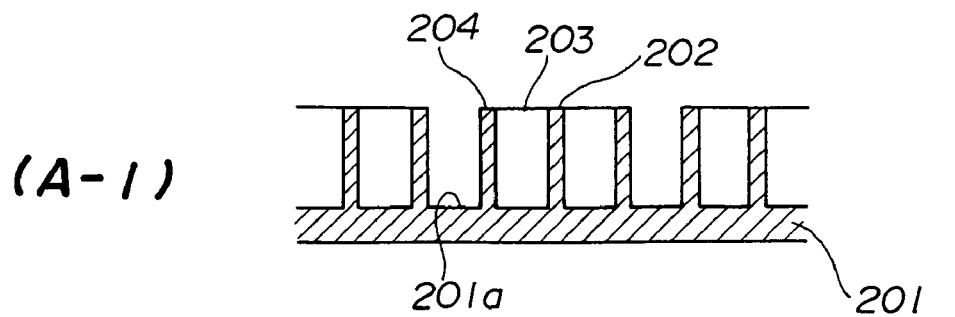
(A-2)
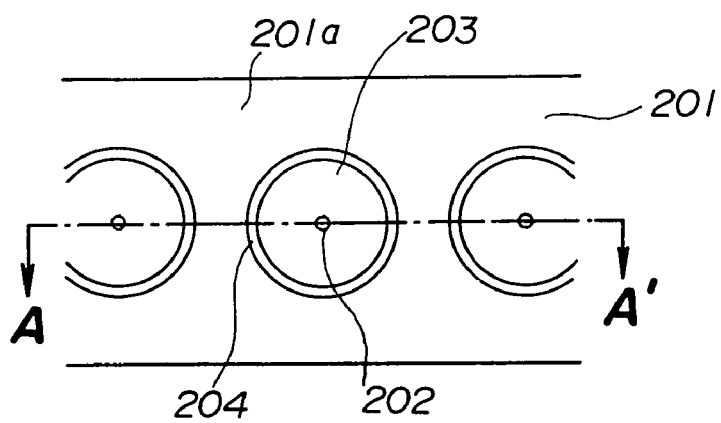
(B-1)
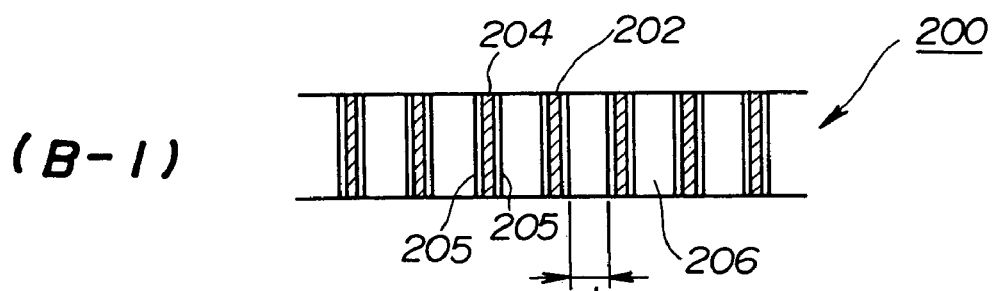
(B-2)
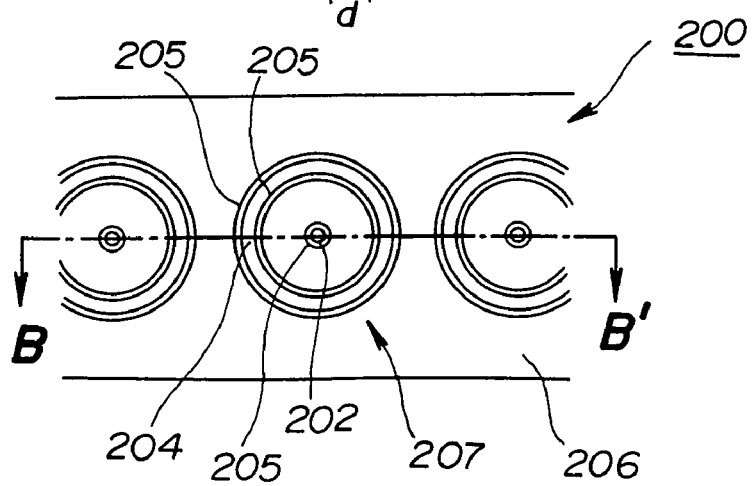

FIG. 7
(C-1)
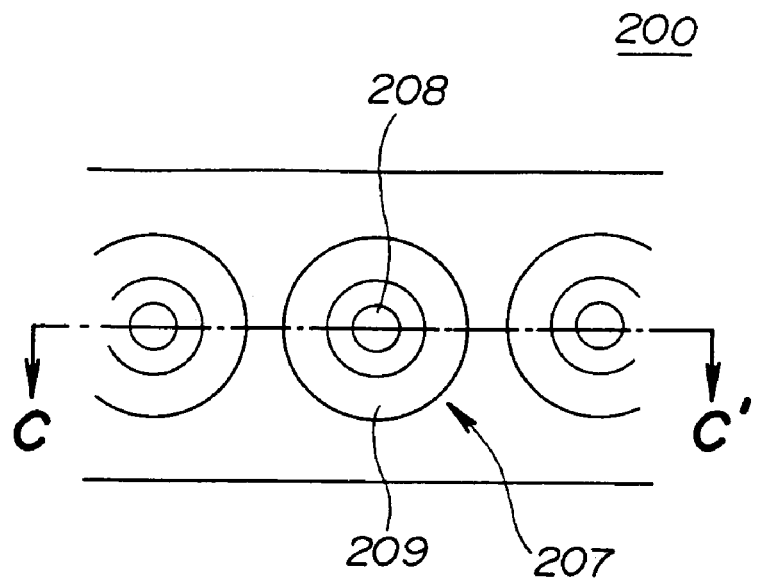
(C-2)
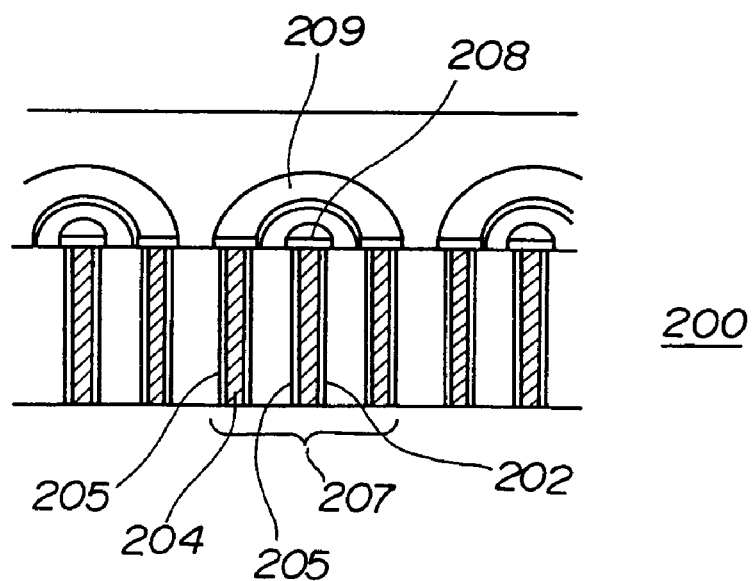

FIG. 9
(A-1)
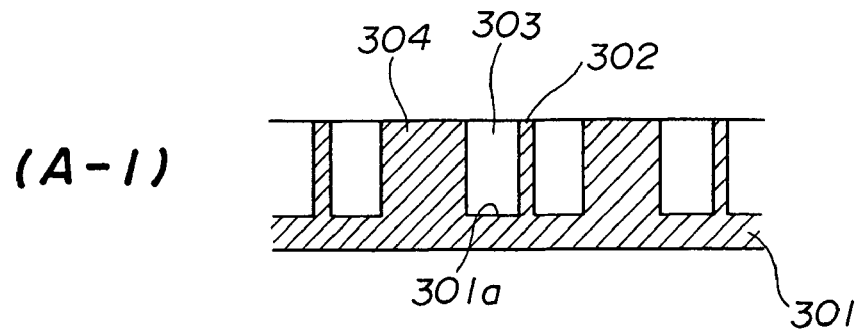
(A-2)
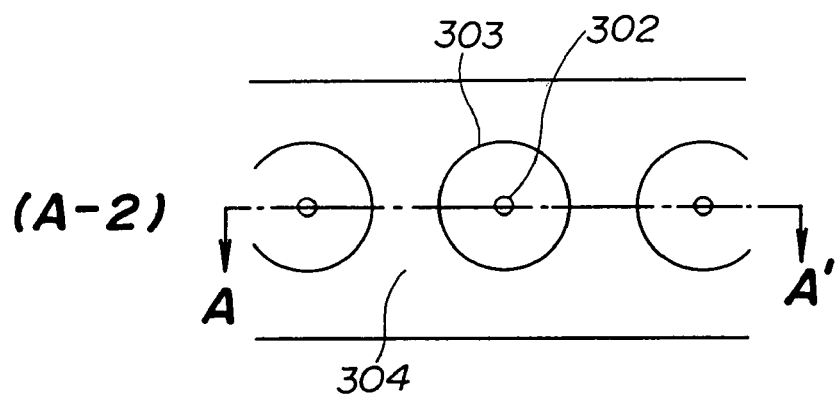
(B-1)
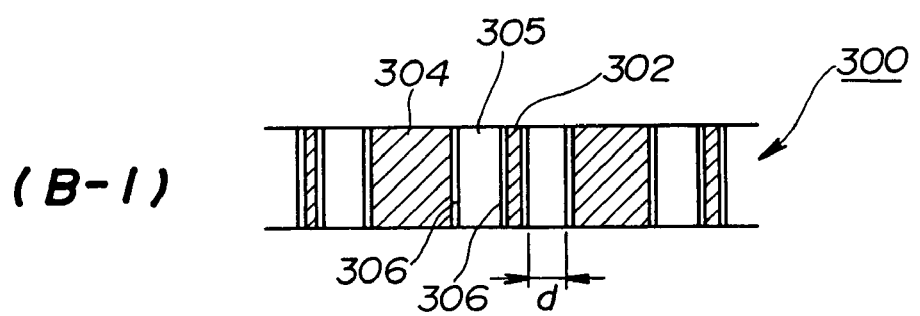
(B-2)
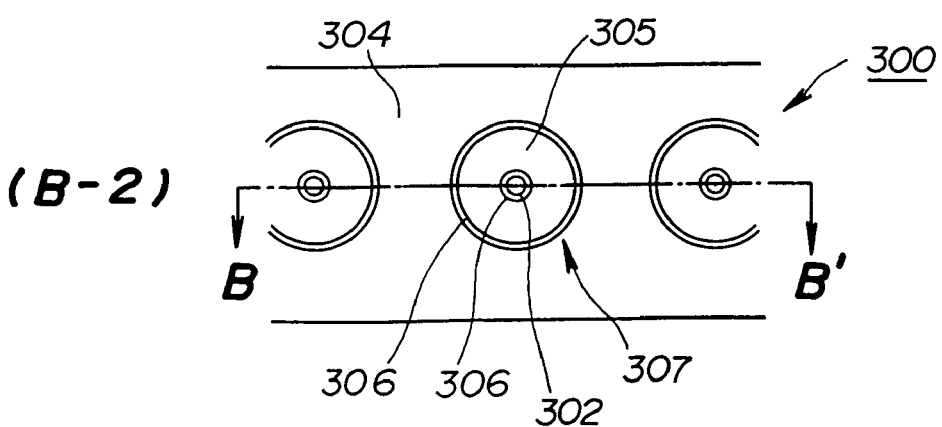

FIG. 10
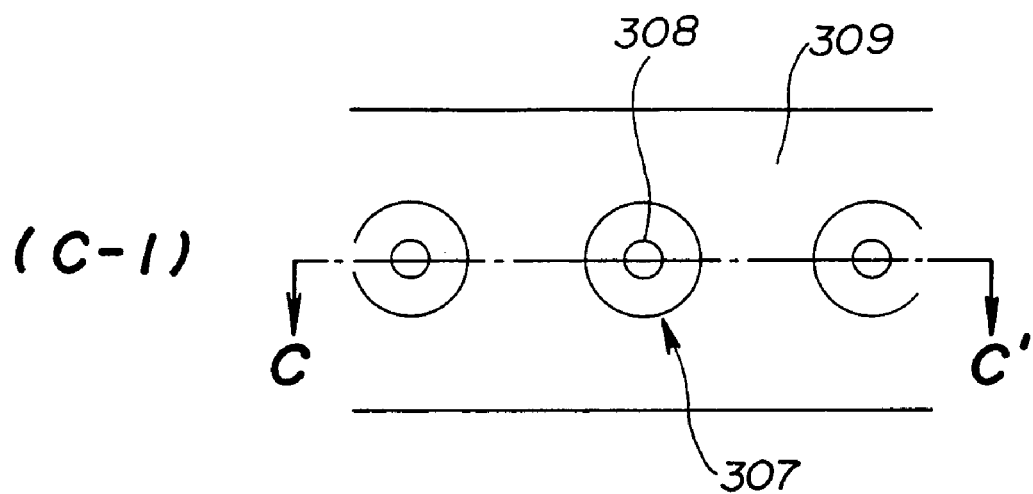
(C-1)
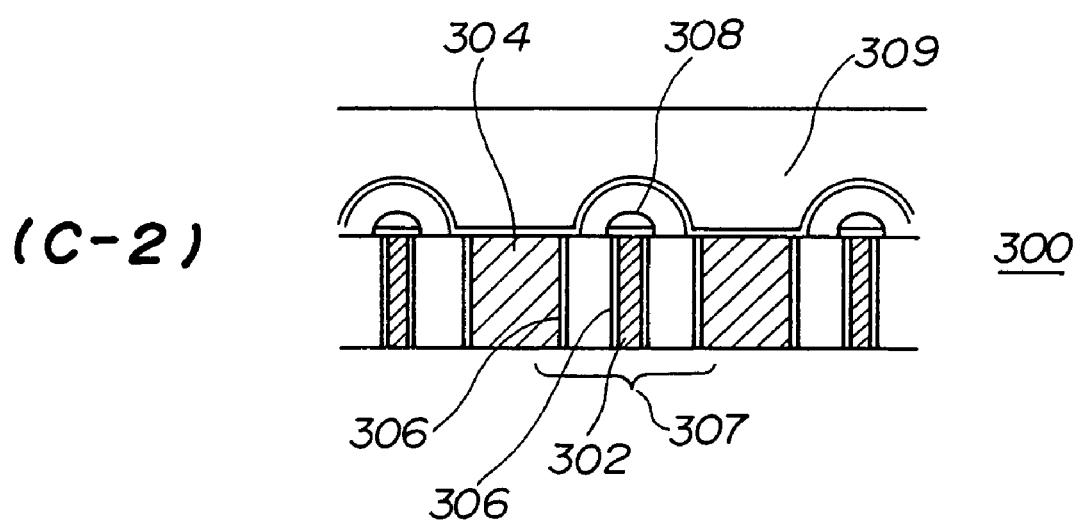
(C-2)

FIG. 11
(A)
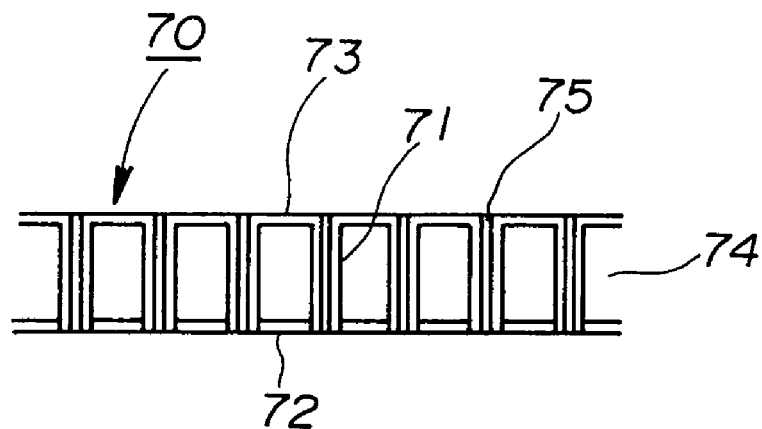
(B)
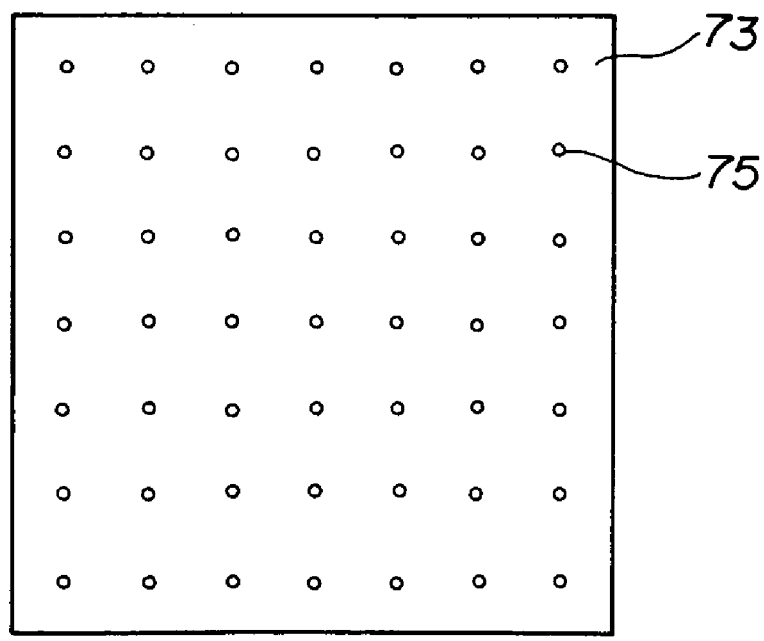

FIG. 12
(A) 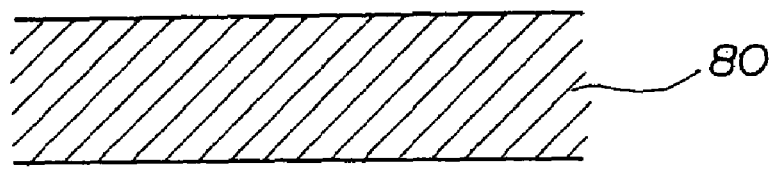
(B) 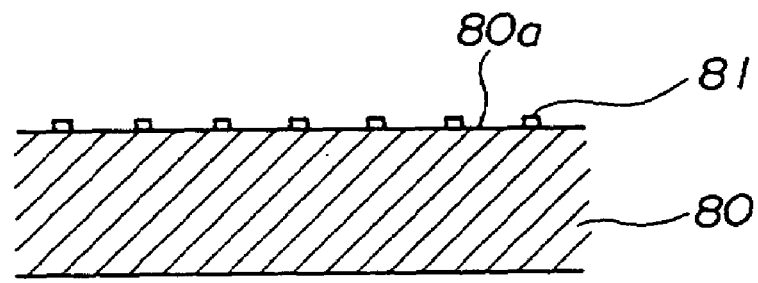
(C) 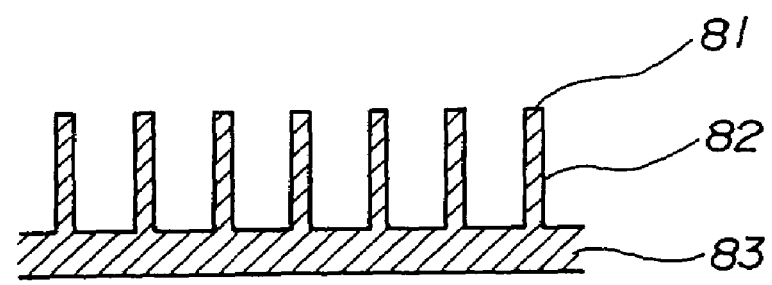
(D) 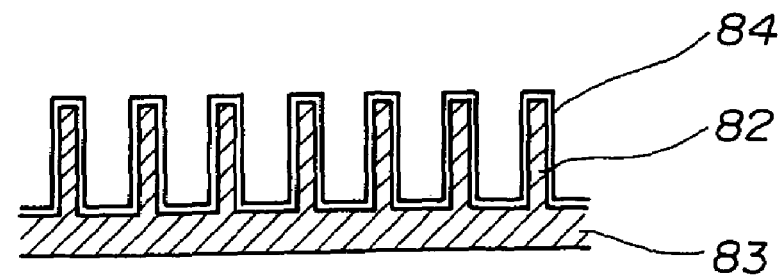

METHOD FOR MAKING A FRONT AND BACK CONDUCTIVE SUBSTRATE

This application is a DIVISION of prior application Ser. No. 09/783,598 filed Feb. 15, 2001.

BACKGROUND OF THE INVENTION

1. Field of the Invention

The present invention relates generally to a front-and-back electrically conductive substrate and a method for manufacturing same, and more particularly, to a high-density front-and-back electrically conductive substrate capable of adapting to the high integration density, increasing post numbers and compactness of the LSIs required for electronic calculators and the like.

2. Description of Related Art

In recent years, the LSI packages and printed wiring boards have needed to acquire ever greater densities as the LSIs and other semiconductor components have become more highly integrated and equipped with a larger number of posts.

With the LSI packages, the LSI chip is mounted face down on a ceramic substrate or an organic substrate. Further, the ceramic substrate or organic substrate is mounted on a printed wiring board using balls of solder.

In order to obtain an electrical conduction between a first surface (that is, a front surface) on which the LSI chip is mounted and a second surface (a back surface) on which the solder balls are formed, through holes are formed in the substrate. A ceramic substrate or a resin substrate having such through-holes is called a front-and-back electrically conductive substrate.

The ceramic substrate is manufactured by punching holes in a green sheet material, such that the front surfaces of the through hole and the front surface of the green sheet are coated with copper plating, a plurality of green sheets are stacked one atop the other, pressed together, and then baked.

A resin substrate is produced by alternately stacking patterned copper sheets and prepreg sheets, pressing them together and then baking them. The baking temperature of the resin substrate is lower than the temperature at which ceramic substrates are baked. After the resin substrate is manufactured, through-holes are opened in the substrate and the surface is coated with copper plating.

It can be anticipated that integration densities will continue to increase in the future, and that as a consequence the diameter of the through holes formed in the substrate will decrease and the pitch of the through holes will decrease as a result.

However, a disadvantage of ceramic substrates is that there is a limit to how narrow the pitch of the through holes can be made, because the holes are formed by the mechanical process of punching the substrate and therefore the through-hole pitch cannot be made shorter than the distance by which the punch itself is fed onward.

In the case of organic substrates as well, the through holes are formed by the mechanical process of drilling holes in the substrate. As a result, organic substrates have the same disadvantage that attends ceramic substrates, that is, that the pitch of the through holes cannot be made shorter than the forward feed pitch of the drill. Moreover, although the drill used in the organic substrate can be made longer and thinner, doing so creates the possibility that the drill bit will break during operation, a possibility that increases as the depth, that is, the aspect, of the through holes increases. It should also be noted that forming the through holes in the ceramic substrate is a process performed one green sheet at a time and is not a high-aspect operation.

Additionally, there is the problem that the plating process that is performed after the through holes have been formed in the substrate will not completely cover the interior of the through holes, particularly as the aspect of the holes increases. As a result, some parts of the inner walls of the through holes may go unplated, thus degrading the reliability of the electrical conductivity.

In the case of the so-called multi chip module, or MCM, in which thin film technology is used to form thin film circuitry on the MCM, it is possible to set the LSI chip bump pitch minutely. However, either a ceramic substrate or a resin substrate as described above is used for the base substrate on which the thin film circuitry is formed, so the same problem of how to narrow the pitch of the through holes remains.

Additionally, high-density integration requires that due consideration be given to noise prevention.

BRIEF SUMMARY OF THE INVENTION

Accordingly, it is an object of the present invention to provide an improved and useful front-and-back electrically conductive substrate and a method for manufacturing same, capable of accommodating demand for enhanced integration densities.

Another and further object of the present invention is to provide an improved and useful front-and-back electrically conductive substrate and a method for manufacturing same, in which anti-noise measures are taken.

The above-described objects of the present invention are achieved by a front-and-back electrically conductive substrate comprising:

a plurality of posts composed of a material that can be anisotropically etched and having an electrically conductive portion that has at least a first surface and a second surface that communicate with each other; and an insulating material that supports the plurality of posts.

According to this aspect of the invention, anistropic etching replaces mechanical processing, so the through-hole pitch is not determined by the pitch forward feed at the time the holes are opened. Additionally, employing anistropic etching allows the formation of high-aspect through-holes.

Additionally, the above-described objects of the present invention are also achieved by a front-and-back electrically conductive substrate comprising:

a first post composed of a material that can be anisotropically etched and having an electrically conductive portion that has at least a first surface and a second surface that communicate with each other;

a second post disposed so as to surround the first post at a distance and having an electrically conductive portion coupled to a ground; and an insulating material that supports the first post and the second post.

According to this aspect of the invention, the posts can be positioned coaxially. Additionally, by adjusting the distance between the first post and the second post the impedance can be adjusted.

Additionally, the above-described objects of the present invention are also achieved by a method for manufacturing a front-and-back electrically conductive substrate, the method comprising the steps of:

forming, by a process of anisotropic etching, a plurality of posts that communicate between at least the first surface and the second surface; and filling space between the posts with an insulating material.

Additionally, the above-described objects of the present invention are also achieved by a multilayer printed wiring board comprising a plurality of inner layer boards stacked atop each other, each of the inner layer boards comprising:

a plurality of posts composed of a material that can be anisotropically etched and having an electrically conductive portion that causes at least a first surface and a second surface to communicate with each other; and insulating material that supports the plurality of posts.

Additionally, the above-described objects of the present invention are also achieved by a printed board unit comprising:

a front-and-back electrically conductive substrate; and a semiconductor component mounted on the front-and-back electrically conductive substrate, the front-and-back electrically conductive substrate comprising:

a plurality of posts composed of a material that can be anisotropically etched and having an electrically conductive portion that has at least a first surface and a second surface that communicate with each other; and an insulative substrate that supports the plurality of posts.

Additionally, the above-described objects of the present invention are also achieved by a front-and-back electrically conductive substrate comprising:

a plurality of posts composed of a material that can be anisotropically etched and having an electrically conductive portion that has at least a first surface and a second surface that communicate with each other;

an insulative substrate that supports the plurality of posts; and an electrically conductive film that surrounds the posts.

Other objects, features and advantages of the present invention will become more apparent from the following detailed description when read in conjunction with the accompanying drawings.

BRIEF DESCRIPTION OF THE DRAWINGS

FIG. 1 shows lateral and plan views of a front-and-back electrically conductive substrate according to a first embodiment of the present invention;

FIG. 6 is a first diagram showing lateral and plan views of a front-and-back electrically conductive substrate according to a second embodiment of the present invention;

FIG. 7 is a second diagram showing lateral and plan views of a front-and-back electrically conductive substrate according to a second embodiment of the present invention;

FIG. 9 is a first diagram showing lateral and plan views of a front-and-back electrically conductive substrate according to a third embodiment of the present invention;

FIG. 10 is a second diagram showing lateral and plan views of a front-and-back electrically conductive substrate according to a third embodiment of the present invention;

FIG. 11 is a diagram showing lateral and plan views of a front-and-back electrically conductive substrate according to a fourth embodiment of the present invention;

FIG. 12 is a first diagram showing steps in a process of manufacturing a front-and-back electrically conductive substrate according to a fourth embodiment of the present invention;

DETAILED DESCRIPTION OF THE INVENTION

Figure 2:
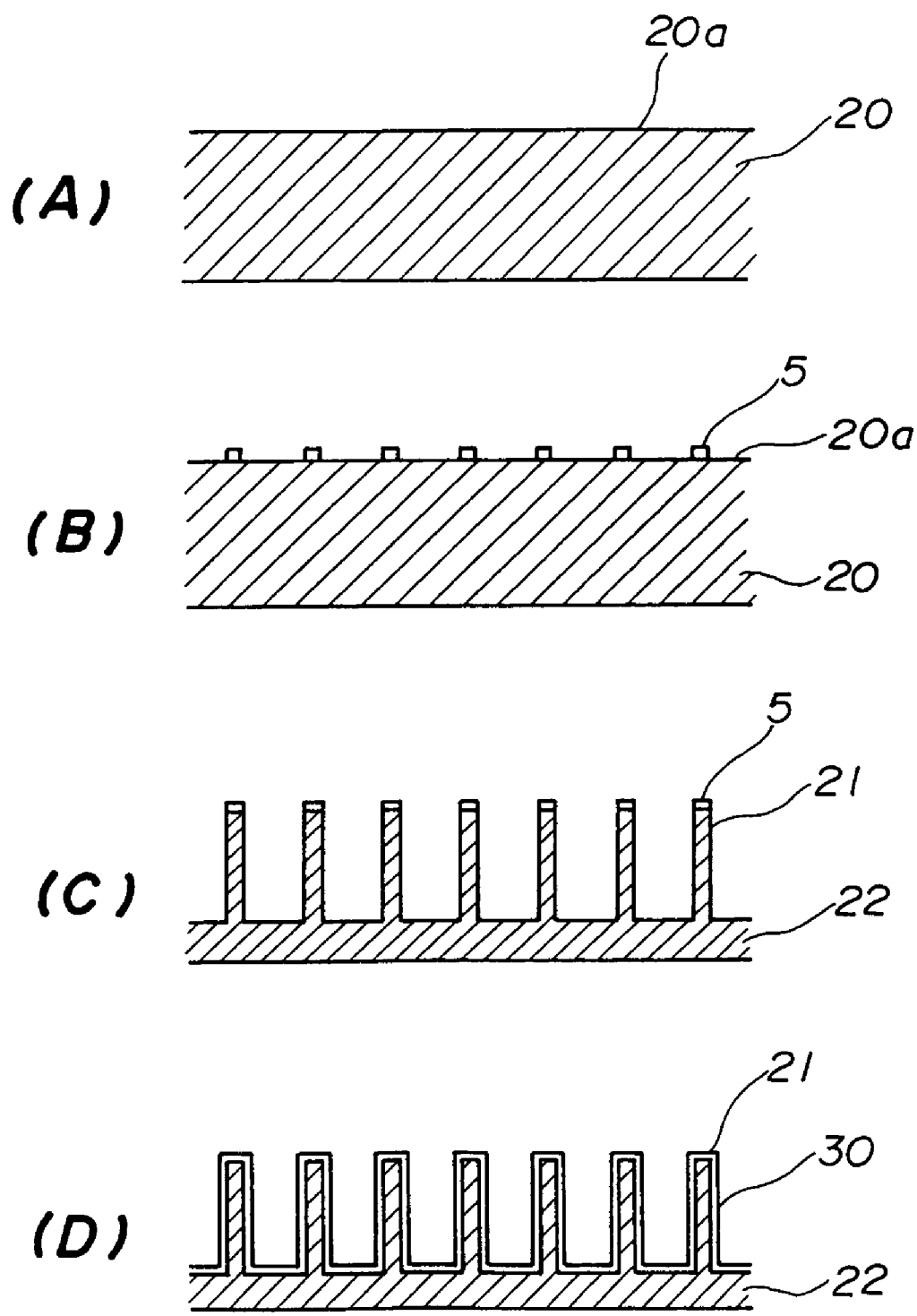
FIG. 2 is a first diagram showing steps in a process of manufacturing a front-and-back electrically conductive substrate according to a first embodiment of the present invention.

A description will now be given of embodiments of the present invention, with reference to the accompanying drawings. It should be noted that identical or corresponding elements in the embodiments are given identical or corresponding reference numbers in all drawings, with detailed descriptions of such elements given once and thereafter omitted.

A description will now be given of a first embodiment of the present invention, with reference to the accompanying drawings.

FIG. 1 shows lateral cross-sectional and plan views of a front-and-back electrically conductive substrate according to a first embodiment of the present invention (hereinafter the first front-and-back electrically conductive substrate). Reference numeral 1 indicates a front-and-back electrically conductive substrate, reference numeral 2 indicates a post, and reference numeral 3 indicates an electrically conductive portion consisting of an electrically conductive film covering a vicinity of a post. The electrically conductive film may be selected as appropriate from among metals such as tungsten, molybdenum, platinum, gold, copper and the like, so long as the metal selected is an electrically conductive metal having a melting point that is higher than the baking temperature of a ceramic-type insulating material to be described later. Reference numeral 4 indicates an insulating substrate, which, in the first front-and-back electrically conductive substrate 1, is a ceramic insulating material. The ceramic insulating material is not subject to any particular limitation, provided it is one used in the production of any commonly known ceramic substrate.

As shown in FIG. 1, the silicon-type posts 2 formed on the first front-and-back electrically conductive substrate are arranged in the form of a matrix. However, the arrangement of the posts 2 is not limited to a matrix formation, provided the number of posts formed at the time the through holes are formed in the front and back of the front-and-back electrically conductive substrate 1 equals the number of posts required for the signal patterns.

A description will now be given of a method for manufacturing the first front-and-back electrically conductive substrate, with reference to FIGS. 2 and 3.

Figure 3:
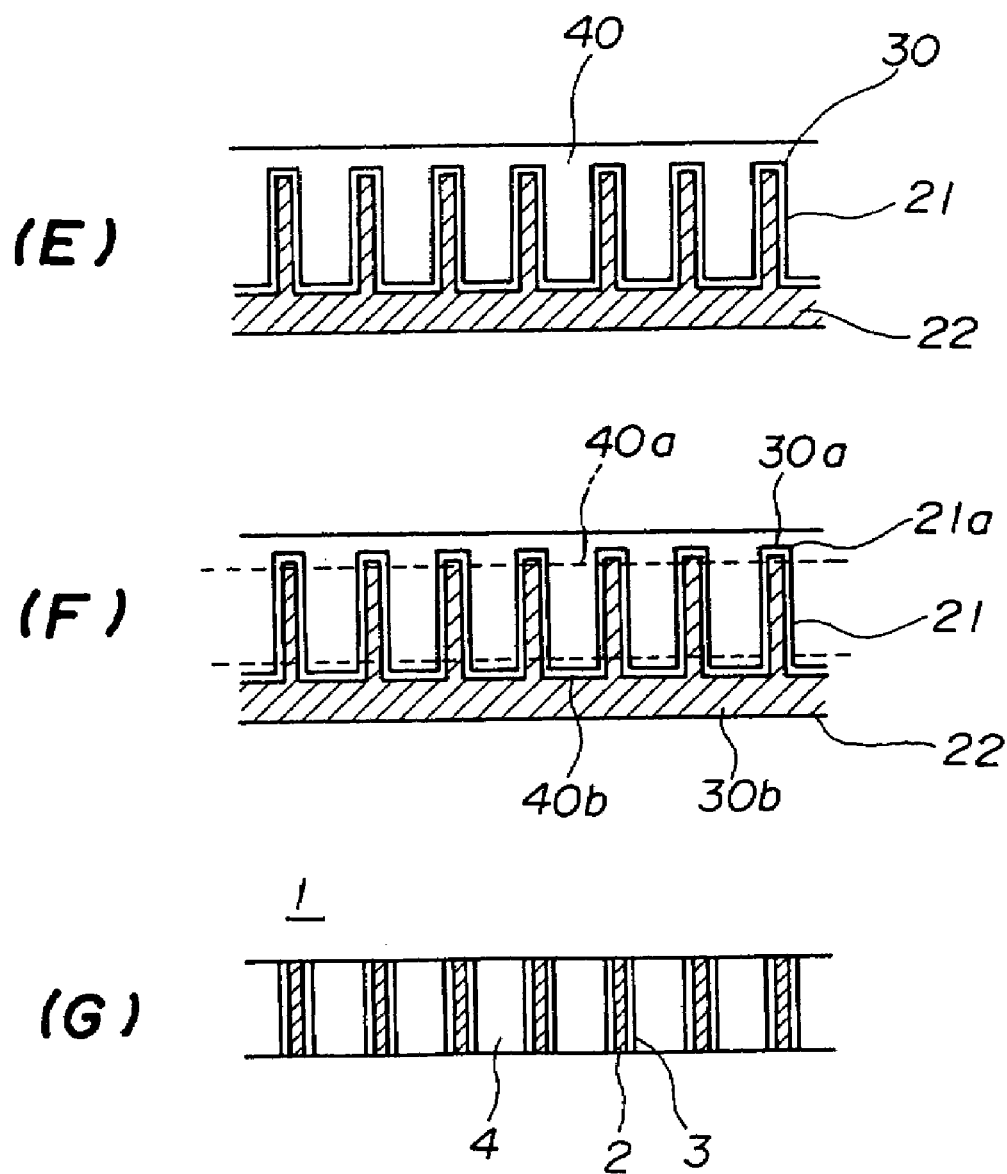
FIG. 3 is a second diagram showing steps in a process of manufacturing a front-and-back electrically conductive substrate according to a first embodiment of the present invention.

FIG. 2 is a first diagram showing steps in a process of manufacturing a front-and-back electrically conductive substrate according to a first embodiment of the present invention. FIG. 3 is a second diagram showing steps in a process of manufacturing a front-and-back electrically conductive substrate according to a first embodiment of the present invention.

First, as shown in step A of FIG. 2, a silicon wafer 20 having a thickness equal to or greater than a height of the silicon posts 2 that form the completed front-and-back electrically conductive substrate is prepared.

A resist is laid down on the front surface 20a of the silicon wafer 20 and spin coated to form a resist film having a thickness of several tens of microns. Next, the resist is exposed and developed to form a resist of a desired pattern 5 as shown in step B of FIG. 2.

The silicon wafer 20 is anisotropically etched using the resist 5 as a mask to form a plurality of high-aspect posts 21 as shown in C of FIG. 2. Either inductive coupling plasma (ICP) etching or photo-induced electrolytic polishing can be used for the anisotropical etching.

ICP etching and photo-assisted electrolytic polishing are techniques used to form minute unevennesses in the molds for making the frames of compact hard disk drives when these molds are produced. Otherwise, these techniques are also used when forming through holes in the silicon chip for the purpose of providing electrical conductivity in a vertical direction when stacking silicon semiconductor chips vertically.

With the use of ICP etching, it becomes possible to form posts 21 having aspect ratios (that is, a ratio of diameter to height) of up to 100 to 1. In other words, if the diameter of the post is 10 µm, then it becomes possible to form posts having heights of up to 1 mm at a pitch of 20 µm. It should be noted that, for illustrative purposes only, the posts 21 of the front-and-back electrically conductive substrate according to the first embodiment of the present invention as described above are given a diameter of 20 µm, a height of 0.6 mm and a pitch of 50 µm.

ICP etching leaves a portion of the silicon wafer 20 intact. In other words, ICP etching is performed so that a connecting portion 22 that connects the plurality of posts 21 remains. The etching speed is set to, for example, 10 µm per minute, so by controlling the duration of etching a connecting portion 22 of appropriate thickness can be formed. When ICP etching is completed the resist 5 is removed by etching.

An electrically conductive film is then laid down over the surfaces of the posts 21 and the connecting portions 22 as shown in D in FIG. 2. An evaporation method or a plating technique may be used for the coating. The electrically conductive film 30 is an electrically conductive metal having a melting point higher than the baking temperature of the insulating substrate. It is preferable that the electrically conductive film 30 be made of tungsten if the posts 21 are to be made of silicon. Silicon and tungsten have similar coefficients of thermal expansion, so when pads are formed on top of them the peeling away of the pads due to a difference in thermal expansion of the posts 21 and the electrically conductive film 30 can be prevented. It should be noted that, in the first embodiment, tungsten is evaporation coated to a thickness of 5 µm.

By plating the exposed surfaces of the posts formed by a process of anistropic etching, it is possible to form high-aspect through holes with great accuracy, a development which springs from a change in technical concept, that is, a change from the idea of flushing etching fluid into the through holes to the idea of plating the exposed surfaces of the posts. In other words, since the pitch is wider than the through-hole diameter, the plating liquid attaches easily to the exposed surfaces of the posts, so there is no deterioration in electrical conductivity. The same holds true when the plating method is replaced with an evaporation technique.

Next, an insulating material is inserted between the posts 21 covered with the electrically conductive film 30. In other words, the insulating material 40 is laid down, with the posts 21 being supported by the material 40. The insulating material 40 is a ceramic powder used when making a typical ceramic substrate, and is supplied over the top of the connecting portion 22 and the electrically conductive film 30 that covers the posts 21 formed by anistropic etching. Thereafter the insulating material 40 is compressed and then baked at a predetermined temperature as shown in E in FIG. 3, to form an insulative substrate over the electrically conductive film 30. The thickness of this insulative substrate is formed to a height greater than that of the posts 21 covered by the electrically conductive film 30.

In addition to ceramic powder, it is also possible to use a glass material for the insulating material. Provided it is a fused glass material possessing some degree of flowability, such material can be supplied over the top of the posts 21 and connecting portions 22 covered by the electrically conductive film 30. For this reason the electrically conductive film 30 is an electrically conductive metal having a melting point above that of the glass material, for example tungsten. After the glass material has been supplied this same glass material is hardened, forming the insulative substrate. The thickness of this insulative substrate, too, is formed to a height above that of the posts 21 covered by the electrically conductive film 30.

Thereafter, both surfaces of the insulative substrate are ground to the position indicated by the dotted line in FIG. 3F. The first front-and-back electrically conductive substrate must be electrically conductive between first and second surfaces, that is, between front and back surfaces, so it is necessary to expose the electrically conductive film to the front and back surfaces. Accordingly, using a commonly known grinding technique, the first surface, for example the front surface, is processed by grinding away a portion 40a of the insulating material 40, a portion 30a of the electrically conductive film 30 and a portion 21a of the posts 21. Viewed from such a surface, the electrically conductive film 30 made of tungsten is formed around the periphery of the silicon posts 21. At the same time, the second surface, for example the back surface, is processed by grinding away the connecting portion 22, the portion of the posts nearest the connecting portions, the electrically conductive film 30b and a portion 40b of the insulating material 40. Viewed from such a surface, the electrically conductive film 30 made of tungsten is formed around the periphery of the silicon posts 21.

By performing the processes described above, the front-and-back electrically conductive substrate 1 having through holes of a diameter of 30 µm, a pitch of 50 µm and a thickness of 0.5 mm is formed.

A description will now be given of the first front-and-back electrically conductive substrate employed as an IC package substrate, with reference to FIG. 4.

Figure 4:
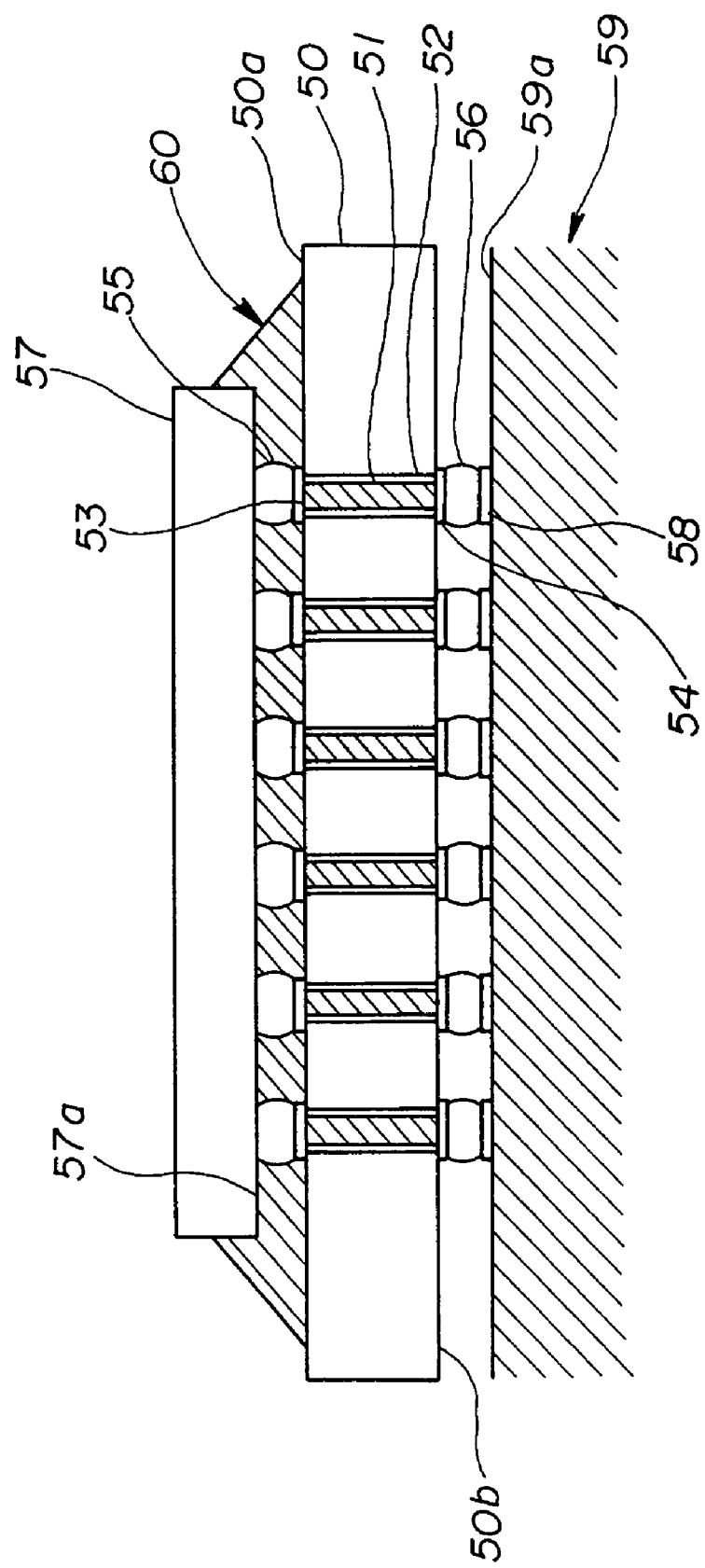
FIG. 4 is a diagram showing the front-and-back electrically conductive substrate according to the first embodiment of the present invention employed as an IC package substrate.

FIG. 4 is a diagram showing the front-and-back electrically conductive substrate according to the first embodiment of the present invention employed as an IC package substrate. In FIG. 4, reference number 50 indicates the first front-and-back electrically conductive substrate, 51 indicates the silicon posts and 52 is an electrically conductive film (made for example from tungsten) that surrounds the posts. A combination of the post 51 and the electrically conductive film 52 forms a through hole that electrically connects the front and back surfaces of the substrate to each other.

A pad 53 is formed on a first surface, for example a front surface of the front-and-back electrically conductive substrate 50 in a state in which the through holes formed by the posts 51 and the electrically conductive film 52 are covered. A metal bump 55, selected as appropriate from for example solder, gold and the like and formed on a front surface 57a of a semiconductor component 57, is joined to the pad 53, so that the semiconductor component 57 can be mounted on the front of the front-and-back electrically conductive substrate 50. It should be noted that a thermo-hardened or photo-cured insulating material adhesive 60 is introduced between the semiconductor component 57 and the front-and-back electrically conductive substrate 50 in order to strengthen the connection between the metal bump 55 and the pad 53 and to prevent corrosion due to humidity in the air.

Similarly, a pad 54 is formed on a second surface, for example a back surface of the front-and-back electrically conductive substrate 50 in a state in which the through holes formed by the posts 51 and the electrically conductive film 52 are covered. A metal bump 56, selected as appropriate from for example solder or gold, is formed on the pad 54. A pad 58 is formed on a front surface 59a of a printed wiring board 59 at a position corresponding to a position at which the metal bump 56 is formed, so that by melting the metal bump 56 the front-and-back electrically conductive substrate 50 with the semiconductor component 57 mounted thereon can be mounted on the printed wiring board 59.

Figure 5:
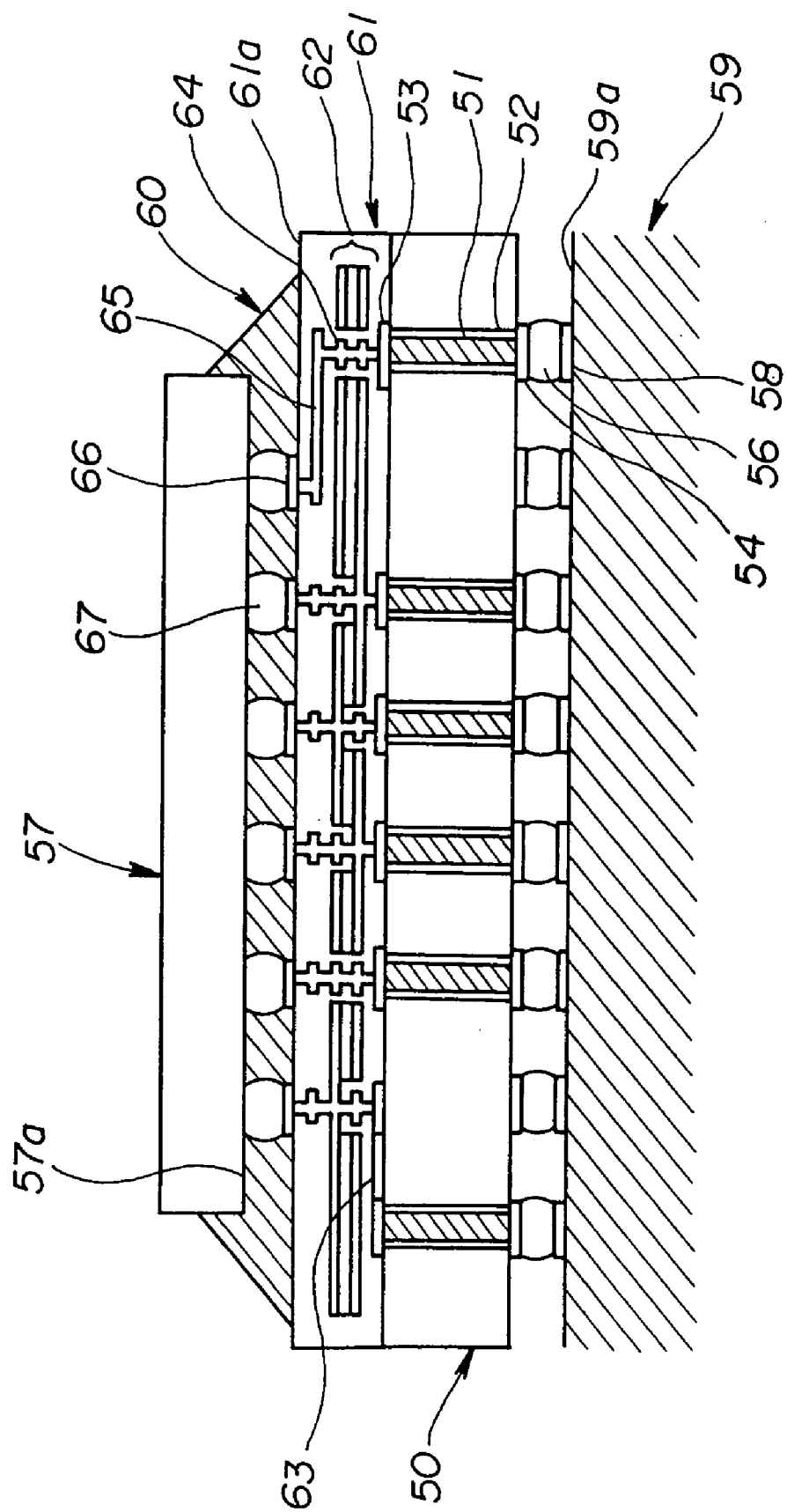
FIG. 5 is a diagram showing a variation of the substrate depicted in FIG. 4.

FIG. 5 is a diagram showing a variation of the substrate depicted in FIG. 4, and, as such, a detailed description thereof shall be omitted.

In embodiment depicted in FIG. 4 shows the semiconductor component 57 mounted directly on the first front-and-back electrically conductive substrate 50. However, as shown in FIG. 5, a thin film 61 may also be inserted between the first front-and-back electrically conductive substrate 50 and the semiconductor component 57. The thin film 61 comprises a minutely fine wiring pattern that connects the semiconductor component 57 and the first front-and-back electrically conductive substrate that enables high-speed signal transmission and achieves high-density wiring. Additionally, the thin film 61 has thin-film condensers 62 and resistors 63 made of stacked signal layers and dielectric layers, as well as inter-layer connectors 64 for the multilayered structure of the thin film 61.

The pad 53 formed on the first front-and-back electrically conductive substrate 50 and the pad 66 formed on the front surface 61a of the thin film 61 are electrically connected via the above-described signal layers and inter-layer connectors. The pad 66 of the thin film 61 and the semiconductor component 57 are joined by a metal bump 67 selected as appropriate from solder, gold and the like.

By introducing the thin film 61 shown in FIG. 5, it becomes possible to reduce the number of components involved in the mounting of functional circuits and to increase the density of mounting by miniaturized pattern formation.

Figure 8:
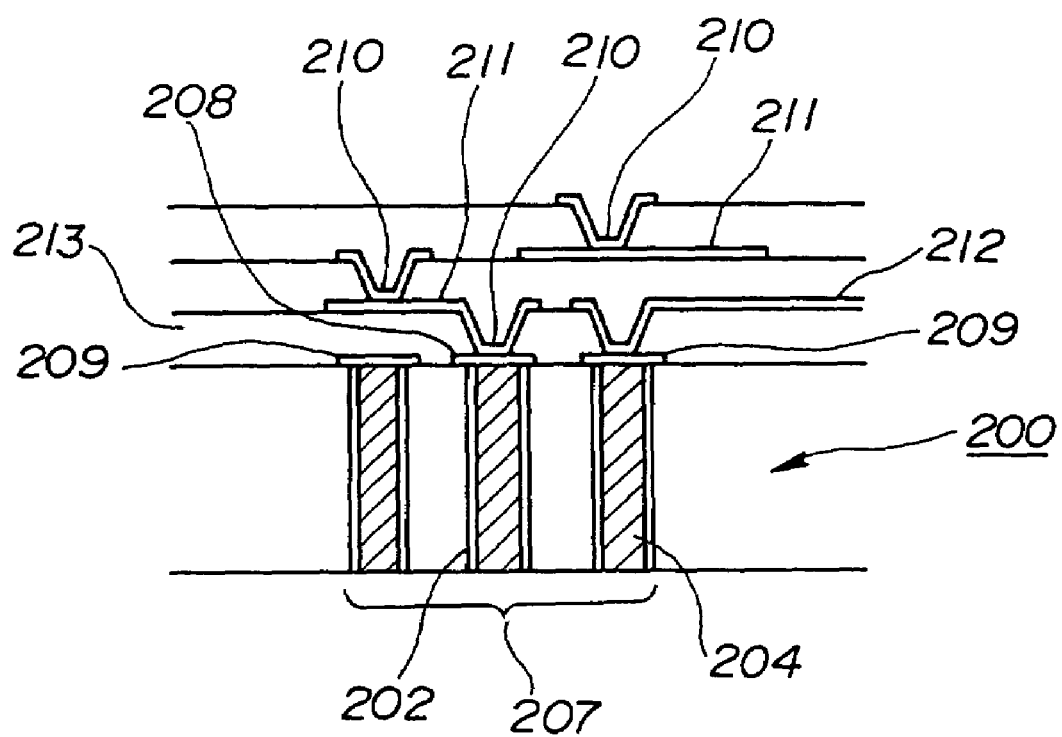
FIG. 8 is a diagram of the wiring structure of a front-and-back electrically conductive substrate according to a second embodiment of the present invention.

A description will now be given of a front-and-back electrically conductive substrate according to a second embodiment of the present invention, with reference to FIGS. 6, 7 and 8 (hereinafter second front-and-back electrically conductive substrate).

The second front-and-back electrically conductive substrate is the same as the first front-and-back electrically conductive substrate described above, with the addition of anti-noise measures. The effective use of co-axial cable as an anti-noise measure is widely known. In other words, in a construction consisting of a wire core, insulating material wrapped around the wire core and a metallic coating that wraps around the insulating material, adjusting the dielectric constant of the insulation as well as the distance from the core wire to the metallic coating makes it possible to create a noise-resistant structure.

The second front-and-back electrically conductive substrate represents the application of the above-described thinking to through holes formed in a front-and-back electrically conductive substrate. As described above, what determines the silicon etching shape is the pattern of the resist, and moreover the resist can be freely selected. By selecting the resist the silicon etching shape can be made adaptable to use with a coaxial construction.

A description will now be given of that manufacturing process, with reference to FIGS. 6, 7 and 8.

FIG. 6 is a first diagram showing lateral and plan views of a front-and-back electrically conductive substrate according to a second embodiment of the present invention. FIG. 7 is a second diagram showing lateral and plan views of a front-and-back electrically conductive substrate according to a second embodiment of the present invention. FIG. 8 is a diagram of the wiring structure of a front-and-back electrically conductive substrate according to a second embodiment of the present invention.

As shown in FIG. 6(A-1), a resist is selected so that the etching shape formed in a silicon wafer 201 becomes a wire core post 202 and a cylindrical post or shaft 204 that surrounds the post 202. Such resist is formed on the surface of the silicon wafer 201 and anistropic etching is carried out. Up to this point the etching process carried out is based on the processes described with reference to (A) through (C) of FIG. 2, resulting in the formation of the post 202 that rises from a floor 201a of the silicon wafer 201 after anistropic etching and the cylindrical shaft 204 separated from the post 202 by a space 203 of a predetermined distance. FIG. 6(A-2) is a top view of the structure shown in (A-1), which is a cross-sectional view along line A–A' of FIG. 6(A-2).

After removing the resist, an electrically conductive film 205 (made for example from tungsten and laid down by a process of plating or evaporation) is formed on an exposed surface of the silicon wafer 201 formed by etching, that is, a front surface of the post 202 and the cylindrical shaft 204 together with the front surface of the floor 201a. The formation of this electrically conductive film is carried out based on the process described in (D) of FIG. 2.

After the electrically conductive film 205 is formed, a ceramic powder commonly used in the production of ceramic substrates is sprinkled atop the silicon wafer on which the electrically conductive film is formed and then baked at a predetermined temperature to form the insulative substrate. This process is performed on the basis of the process described with respect to (E) of FIG. 3. It should be noted that instead of ceramic powder a glass material may also be employed as the insulating material 206.

Provided it is a fused glass material possessing some degree of flowability, such material can be supplied to areas covered by the electrically conductive film 205. After being so supplied the glass material is hardened and the insulative substrate formed.

Thereafter, both front and back surfaces of the insulative substrate are ground so as to expose the electrically conductive film 205 at the front and back surfaces.

That which is formed by the processes described so far is the second front-and-back electrically conductive substrate 200 as shown in (B-1) of FIG. 6. A coaxial through hole 207 can be formed with the electrically conductive film 205 that covers the front surface of the posts 202, the electrically conductive film 205 that covers the back surfaces of the cylindrical shafts 204, and the insulating material 206 used to fill the space between the posts 202 and the cylindrical shafts 204. (B-2) of FIG. 6 shows a top view of such a formation, such that (B-1) is a cross-section along a line B–B' shown in (B-2) in FIG. 6.

Next, as shown in (C-1) in FIG. 7, pads 208 and pads 209 are formed on the ground-off surface of the second front-and-back electrically conductive substrate 200. As shown in (C-2) of FIG. 7, which is a cross-sectional view along a line C–C' shown in (C-1) of FIG. 7, the pad 208 is formed atop the post that corresponds to the wire core of the coaxial structure 202 so as to be electrically connected to the electrically conductive film 205. As shown in (C-2) of FIG. 7, which is a cross-sectional view along a line C-C' shown in (C-1) of FIG. 7, the pad 209 is formed atop the cylindrical shaft 204 that surrounds the pad 208 so as to be electrically connected to the electrically conductive film 205.

In order to make the coaxial through holes 207 formed in the second front-and-back electrically conductive substrate 200 function effectively, it is necessary to electrically ground the cylindrical shaft 204 that surrounds the post 202 that corresponds to the wire core used as a signal wire. For this purpose, as shown in FIG. 8 a thin film is formed by stacking a signal pattern layer 211, a ground pattern layer 212 and an insulation layer 213 atop the second front-and-back electrically conductive substrate 200. Then the pad 209, which is electrically connected to the electrically conductive film 205 covering the exposed surface of the post 204, is connected to the ground pattern 212 formed on the thin film via an interlayer connector 210 called a VIA.

At the same time, by another interlayer connector 210 called a VIA which is located within the thin film itself and which leads to the signal pattern layer, signals from the pad 208 connected to the post 202 covered by the electrically conductive film are conducted to the topmost surface of the thin film.

According to the second front-and-back electrically conductive substrate as described above, a desired impedance can be achieved by setting the dielectric constant of the insulation as well as the distance of the insulation in the coaxial through hole 207 shown as "d" in (B-1) of FIG. 6.

It should be noted that although the second front-and-back electrically conductive substrate has been described with reference to FIG. 6 and FIG. 7 in which the through holes have been arranged in rows, in fact the arrangement of the through holes is not limited to such a disposition but may be set as convenient by altering the number of signal wires or changing the form of the wiring circuitry. For example, the through holes may be arranged in a matrix as shown in the first front-and-back electrically conductive substrate depicted in FIG. 1.

A description will now be given of a front-and-back electrically conductive substrate according to a third embodiment of the present invention, with reference to FIGS. 9 and 10 (hereinafter the third front-and-back electrically conductive substrate).

FIG. 9 is a first diagram showing lateral and plan views of a front-and-back electrically conductive substrate according to a third embodiment of the present invention. FIG. 10 is a second diagram showing lateral and plan views of a front-and-back electrically conductive substrate according to a third embodiment of the present invention. As can be appreciated, both diagrams show that the third front-and-back electrically conductive substrate is a substrate that, like the second front-and-back electrically conductive substrate, employs a coaxial through hole construction, essentially a variation of the through hole construction shown in the second front-and-back electrically conductive substrate.

The coaxial through holes formed in the second front-and-back electrically conductive substrate employ a configuration in which the cylindrical shafts 204 are supported by the insertion of ceramic or glass insulation material 206 in the gaps between adjacent cylindrical shafts 204. However, with the third front-and-back electrically conductive substrate the cylindrical shafts are not supported by the insulation material. Instead, etching is carried out so that silicon remains and no gap appears, essentially filling the gap with silicon.

As shown in (A-1) in FIG. 9, a resist is selected such that the etching shape formed on a silicon wafer 301 removes only a portion 303 that forms the insulation of the coaxial structure. Such resist is formed on the front surface of the silicon wafer 301 and anistropic etching conducted. In other words, by this etching a floor 301a is left and a depression formed in an originally flat silicon wafer 301, with a post 302 being formed in the center of such depression, the post corresponding to the wire core of the coaxial structure. The depression becomes the portion 303 that forms the insulation of the coaxial structure, of which (A-2) of FIG. 9 affords a plan view, with (A-1) of FIG. 9 being a cross-sectional view along a line A–A' in (A-2).

Next, and similar to the second front-and-back electrically conductive substrate, by a process based on the steps outlined in (D), (E),and (F) of FIG. 2, the front surface of the silicon wafer 301 is covered by an electrically conductive film 306 that forms an electrically conductive portion. After the insulation material 305 is supplied both surfaces are ground to produce the third front-and-back electrically conductive substrate 300 shown in (B-1) of FIG. 9, of which (B-2) of FIG. 9 affords a plan view, with (B-1) of FIG. 9 being a cross-sectional view along a line B-B' in (B-2).

With the third front-and-back electrically conductive substrate 300 as well, pads corresponding to the pads 208 and 209 of the second front-and-back electrically conductive substrate are formed. As shown in (C-1) of FIG. 10, a pad 308 electrically connected to an electrically conductive film 306 that covers the top surface of the post. 302 that corresponds to the wire core of a coaxial structure is formed. Additionally, as shown in (C-1) of FIG. 10, a metallic pattern 309 is formed over the ground surface, that is, the silicon block 304, except for the pad 308 and-the insulation 305.

The coaxial through holes 307 formed in the third front-and-back electrically conductive substrate 300 are formed by the posts 302 covered by the electrically conductive film 306, the insulation 305 that surrounds the posts 302, and the electrically conductive film 306 that covers the surface of the silicon block 304.

In order to make the coaxial through holes 307 formed in the second front-and-back electrically conductive substrate 300 function effectively, that is, in order to electrically connect the pattern 309 to the ground layer, similar to the second front-and-back electrically conductive substrate 200 a thin film consisting of multiple plies of insulated signal pattern layers and ground pattern layers is formed on the third front-and-back electrically conductive substrate. Then, the pattern 309 is electrically connected to the ground pattern layer formed on the thin film via an interlayer connector. At the same time, the signal pattern layer 308 is electrically connected to the pad 308 via another interlayer connector. Signals from the pad 308 connected to the posts 302 covered with electrically conductive film are led to the uppermost thin film surface via a plurality of signal pattern layers.

According to the third front-and-back electrically conductive substrate as described above, a desired impedance can be achieved by setting the dielectric constant of the insulation as well as the distance of the insulation in the coaxial through hole 307 shown as "d" in (B-1) of FIG. 9. By being able to adjust the impedance value it is possible to provide a noise-resistant front-and-back electrically conductive substrate.

Additionally, with the third front-and-back electrically conductive substrate as described above, the coaxial through hole gap is filled with silicon, so the amount of insulating material used can be reduced as compared to the second front-and-back electrically conductive substrate and manufacturing costs can be reduced as well.

It should be noted that although the foregoing description of the third front-and-back electrically conductive substrate references FIGS. 9 and 10, in fact the arrangement of the through holes is not limited to such a disposition as that shown in the diagrams but may instead be determined as convenient by adjusting the number of signal lines or changing the form of the wiring circuitry. For example, the through holes may be arranged in a matrix as shown in the first front-and-back electrically conductive substrate depicted in FIG. 1.

A description will now be given of a front-and-back electrically conductive substrate according to a fourth embodiment of the present invention (hereinafter fourth front-and-back electrically conductive substrate) with respect to the accompanying drawings, in particular FIGS. 11, 12 and 13.

FIG. 11 is a diagram showing lateral and plan views of a fourth front-and-back electrically conductive substrate. FIG. 12 is a first diagram showing steps in a process of manufacturing a fourth front-and-back electrically conductive substrate. FIG. 13 is a second diagram showing steps in a process of manufacturing a fourth front-and-back electrically conductive substrate.

As shown in the diagrams, reference numeral 70 is the front-and-back electrically conductive substrate and reference numeral 75 represents the through holes. An electrically conductive film 71 made from a metal selected as appropriate from among a group of metals consisting of, for example, copper, tungsten, molybdenum, platinum, gold and so forth is formed on lateral side surfaces. In the present embodiment, these surfaces are coated with copper.

As shown in FIG. 11, the through holes 75 in the fourth front-and-back electrically conductive substrate are arranged in the form of a matrix. However, it should be noted that the arrangement of the through holes 75 is not limited to such a matrix. Instead, as many through holes as are required for the signal patterns may be formed through the front and back surfaces of the front-and-back electrically conductive substrate 1.

Reference numeral 72 indicates a conductive layer formed on a back surface, and in this case the layer is made of copper. Reference numeral 73 indicates a conductive layer formed on a front surface, and in this case the layer is made of copper. Reference numeral 74 indicates a resin insulation, for example an organic resin such as epoxy or polyimide. Conductive layers 72 and 73, as shown in FIG. 11, are formed across the entire front and back surfaces of the fourth front-and-back electrically conductive substrate 70 except where the through holes are formed.

Next, a description will be given of a method of manufacturing the fourth front-and-back electrically conductive substrate as described above, with reference to FIGS. 12 and 13.

Steps (A) through (D) of the method of manufacturing the fourth front-and-back electrically conductive substrate shown in FIG. 12 are identical to steps (A) through (D) of the method of manufacturing the first front-and-back electrically conductive substrate shown in FIG. 2, so a detailed description of these steps shall be omitted. It should be noted that, in FIG. 12, reference numeral 80 indicates a silicon wafer, and corresponds to reference numeral 20 of FIG. 2. Reference numeral 80a indicates a front surface of the silicon wafer 80, and corresponds to reference numeral 20a of FIG. 2. Reference numeral 81 indicates a resist, and corresponds to reference numeral 5 of FIG. 2. Reference numeral 82 indicates posts, and corresponds to reference numeral 21 of FIG. 2. Reference numeral 83 is a connecting portion, and corresponds to reference numeral 22 in FIG. 2. Reference numeral 84 is an electrically conductive film, and corresponds to reference numeral 30 in FIG. 2. The electrically conductive film 84 is formed for example by a process of electroplating copper.

Next, a coating of epoxy or prepreg organic resin 740 is applied so as to fill a space between the posts 82 on which the electrically conductive film 84 is formed, after which the resin is then baked at a predetermined temperature and hardened. As a result, the organic resin 740 is formed so as to completely cover the posts 82 on which the electrically conductive film 84 is formed, as shown in (E) in FIG. 13.

Figure 13:
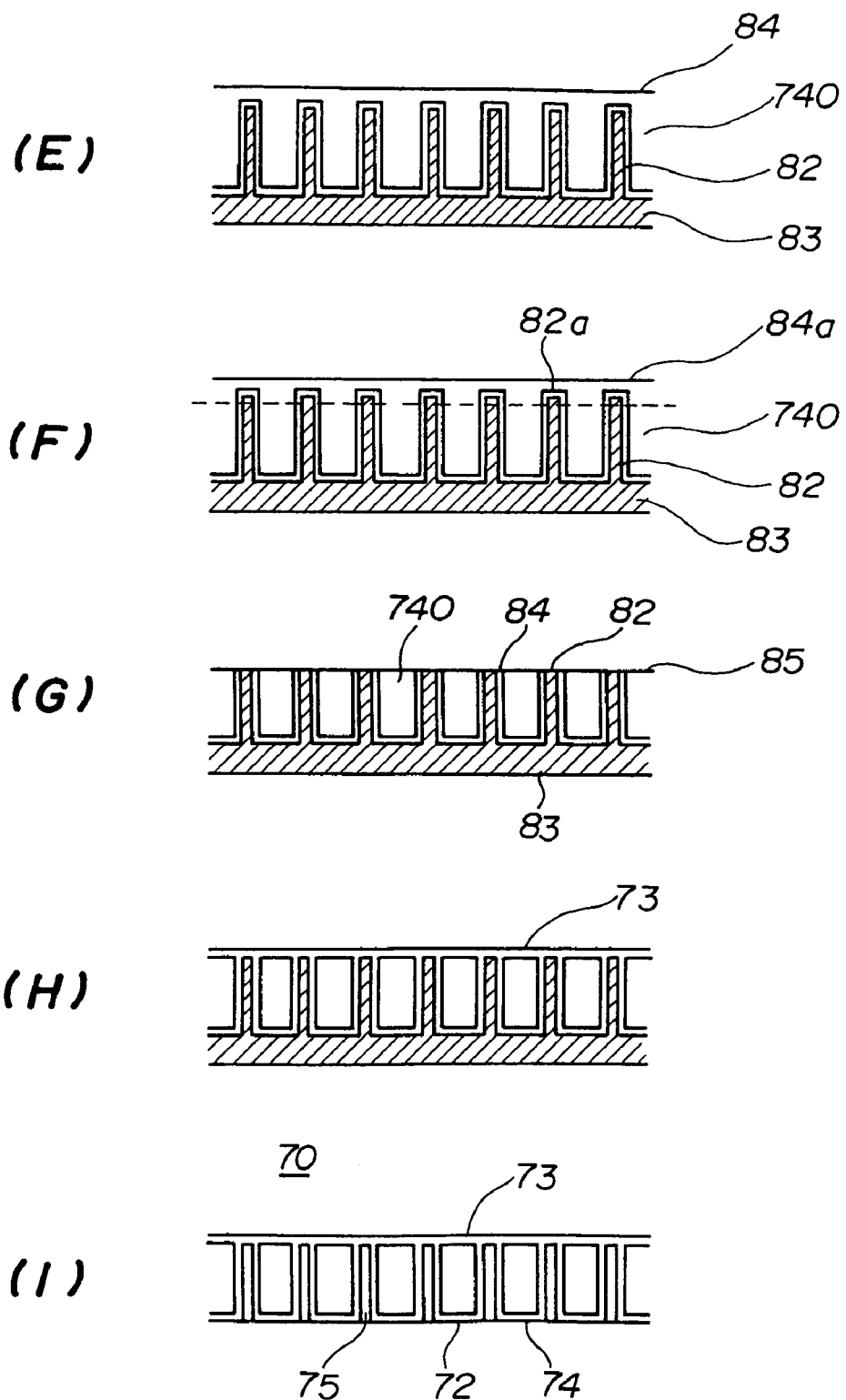
FIG. 13 is a second diagram showing steps in a process of manufacturing a front-and-back electrically conductive substrate according to a fourth embodiment of the present invention.

Thereafter, as shown in (F) in FIG. 13, the organic resin 740 is ground to the level indicated by the dashed line, as a result of which a portion 82a of the silicon post and a portion 84a of the electrically conductive film 84 is exposed from the ground surface 85 as shown in (G) in FIG. 13. It should be noted that one surface of the fourth front-and-back electrically conductive substrate is left untouched, that is, is not ground.

In order to form conductive layers on both surfaces, as shown in (H) in FIG. 13, a copper conductive film is formed on the ground surface by either a plating process or an evaporation method. This conductive layer 73 is formed across the entire ground surface except for the positions at which the silicon posts 82 are located.

Thereafter, as shown in (I) in FIG. 13, the silicon is removed by etching, which removes the silicon connecting portion 83 and silicon posts 82. Additionally, it should be noted that the etching need not be anistropic etching but may instead be isotropic etching.

The electrically conductive film 84 is formed as a conductive layer 72 on the unground surface of the resin insulation 74. Additionally, the electrically conductive film 84 surrounding the posts 82 becomes a conductor formed on lateral wall surfaces of the through hole 75, by which the front and back surfaces can be made electrically conductive.

Next, a description will be given of a fourth front-and-back electrically conductive substrate employed as a multi-layer printed wiring board, with reference to FIG. 14.

Figure 14:
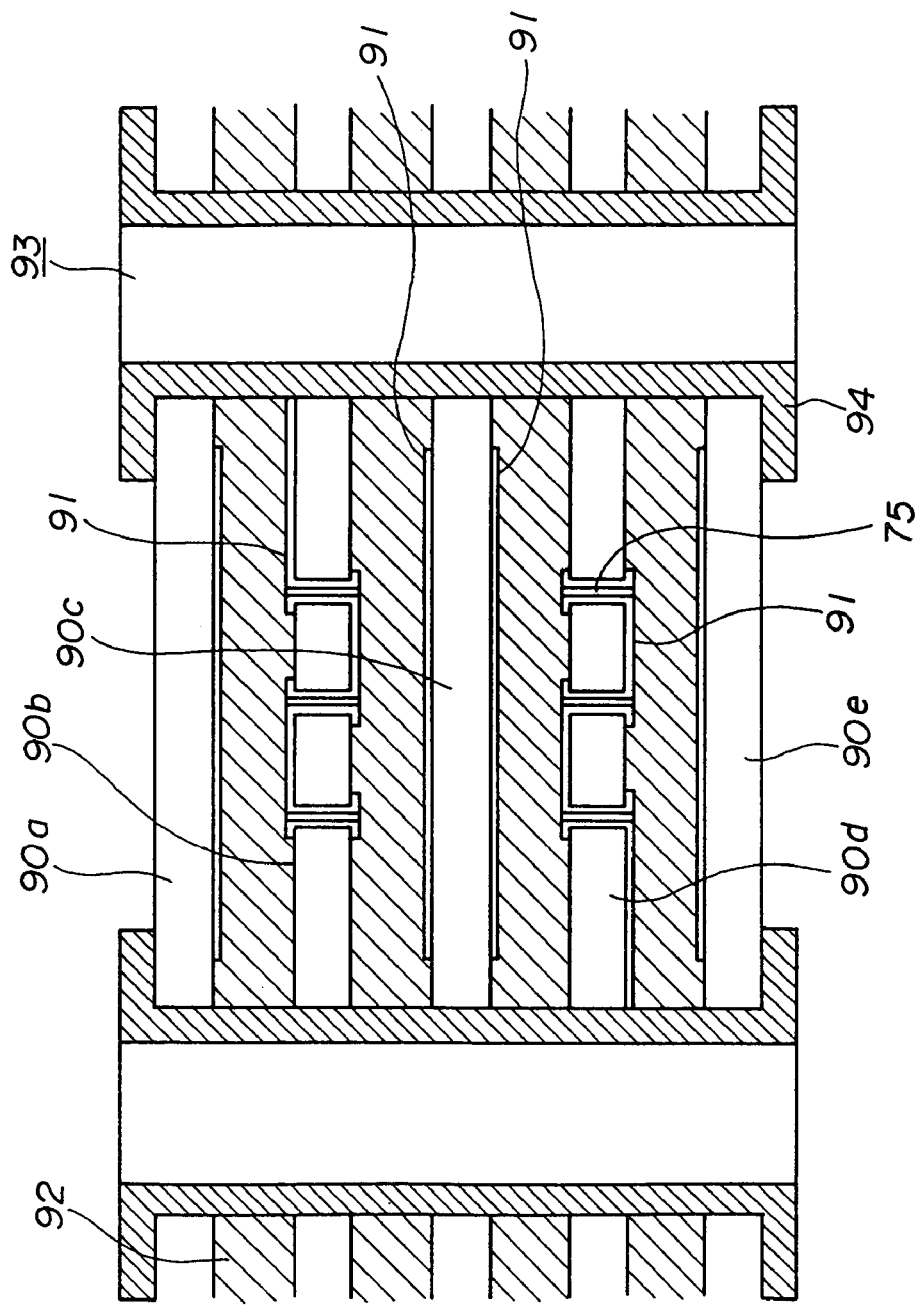
FIG. 14 is a diagram showing the front-and-back electrically conductive substrate according to a fourth embodiment of the present invention employed as a multilayer printed wiring board.

FIG. 14 is a diagram showing the front-and-back electrically conductive substrate according to a fourth embodiment of the present invention employed as a multilayer printed wiring board. This multilayer printed wiring board may be used as a mounting substrate for a variety of semiconductor components and, in addition, can also be used as a mother board for mounting printed wiring boards that become daughter boards.

The fourth front-and-back electrically conductive substrate 90 has a copper conductor layer formed on both surfaces thereof, so that each fourth front-and-back electrically conductive substrate 90 may be used as inner layer boards of the printed wiring board. Depending on the application, the conductive layer 91 may be formed as a power supply layer, a ground layer or a signal pattern layer. The printed wiring board is formed by alternately stacking a plurality of prepreg sheets 92 between inner layer boards of the fourth front-and-back electrically conductive substrate and hard baking at a predetermined temperature to form both sheets and boards into a single unit. It should be noted that, in the case shown in FIG. 14, the multilayer printed wiring board is formed by alternately stacking five of the fourth front-and-back electrically conductive substrate with four of the prepreg sheets.

Thereafter, holes are formed through the multilayer printed wiring board using a drill or the like, after which the walls of the through holes are coated with an electrically conductive plating film 94 using a common plating method to form finished through holes 93.

Using the fourth front-and-back electrically conductive substrate 90 as inner layer boards of a multilayer printed wiring board significantly improves circuit density of the inner layers. Further, by improving circuit density per layer the number of layers used can be reduced, which has the added effect of improving multilayer printed wiring board production yield.

Figure 15:
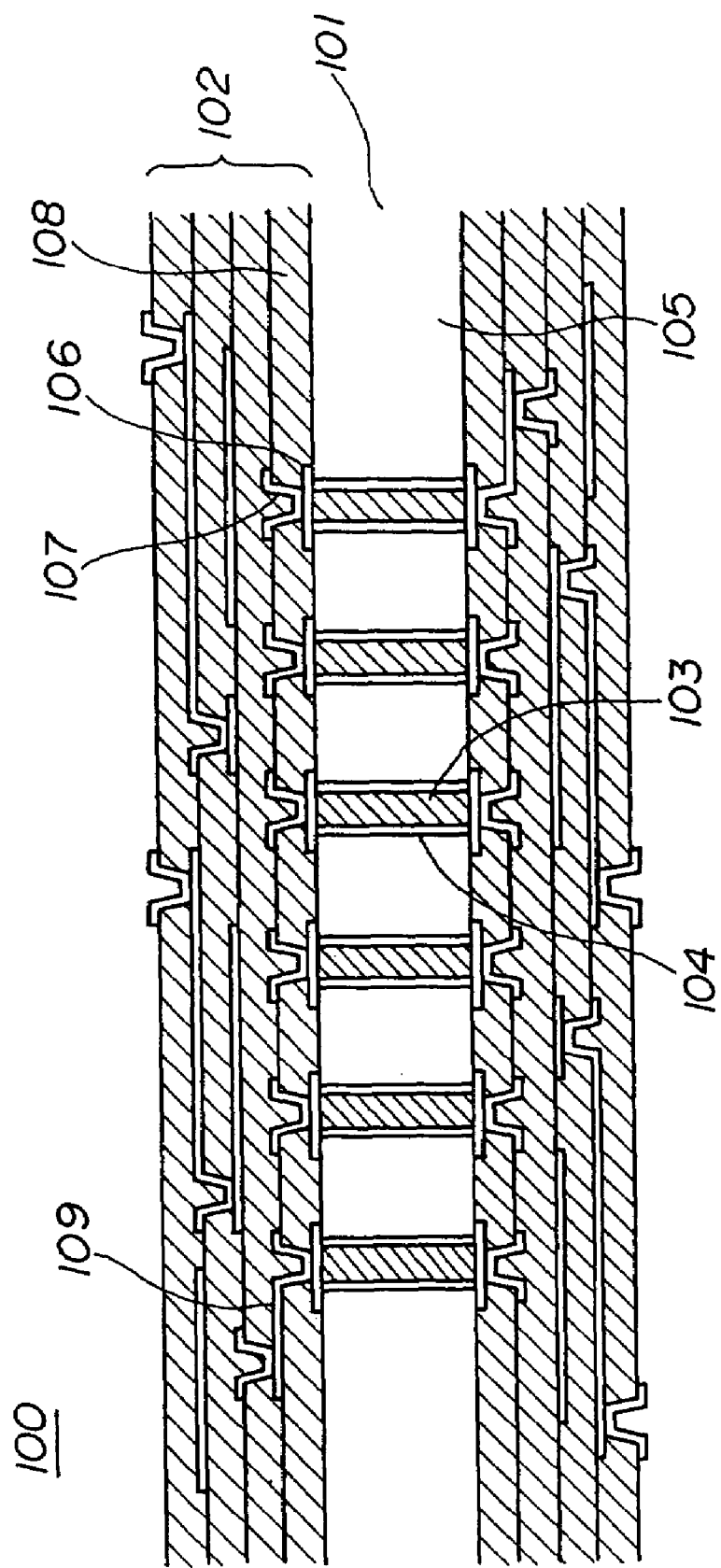
FIG. 15 is a diagram showing the front-and-back electronically conductive substrate according to a fourth embodiment of the present invention employed as a core substrate.

Additionally, the fourth front-and-back electrically conductive substrate can also be adapted as a core substrate of a MCM-L (Laminate) or MCM-LD (LD Laminate and Deposit). FIG. 15 shows a case in which the fourth front-and-back electrically conductive substrate is employed as an MCM-LD core substrate.

Specifically, FIG. 15 is a diagram showing the front-and-back electronically conductive substrate according to a fourth embodiment of the present invention employed as a core substrate.

The core substrate 100 shown in FIG. 15 is formed by wiring layers 102 formed on the front and back surfaces of the fourth front-and-back electrically conductive substrate 101 comprising through holes formed by silicon posts 103, an electrically conductive film 104 that surrounds the posts, and a resin insulation 105 used to fill space between through holes. The wiring layers 102 are connected to pads 106 formed in the through holes formed in the fourth front-and-back electrically conductive substrate 101 (which is composed of alternating conductive layers 109 and insulating layers 108) by interlayer connectors called VIAs 107. A plurality of semiconductor components not shown in the diagram are mounted on the front surface of the thin film wiring layer 102.

When using the fourth front-and-back electrically conductive substrate 101 as a MCM-LD core substrate 100, it is desirable that the silicon posts 103 remain as they are. The first reason for so doing is that, if the posts remain as they are, the silicon posts 103 function as foundations when forming the pad 106 on top of the through hole, which improves the shape of the pad.

If, for example, there were no posts and the through holes were hollow, then the pads 106 deform when attaching the film-like insulating layers 108 by vacuum suction, degrading the quality of the seal between the fourth front-and-back electrically conductive substrate and the insulating layer 108. The deterioration in the quality of the seal is especially marked around deformed pads. Avoiding this defect is the second reason for retaining the silicon posts 103 in place.

In order to eliminate these two defects it is usually necessary to add a follow-on processing step of filling the through hole, but this additional and usually necessary step can be eliminated by intentionally retaining the posts in place. The posts can be intentionally retained by adjusting the etching time, with due consideration for the etching speed.

Further, in the case of the fourth front-and-back electrically conductive substrate as described above, differences in the coefficient of thermal expansion between the mounted semiconductor components and the fourth front-and-back electrically conductive substrate itself can be compensated for by adding appropriate amounts of silicon oxide or aluminum oxide to the epoxy or polyimide resin insulation.

Figure 16:
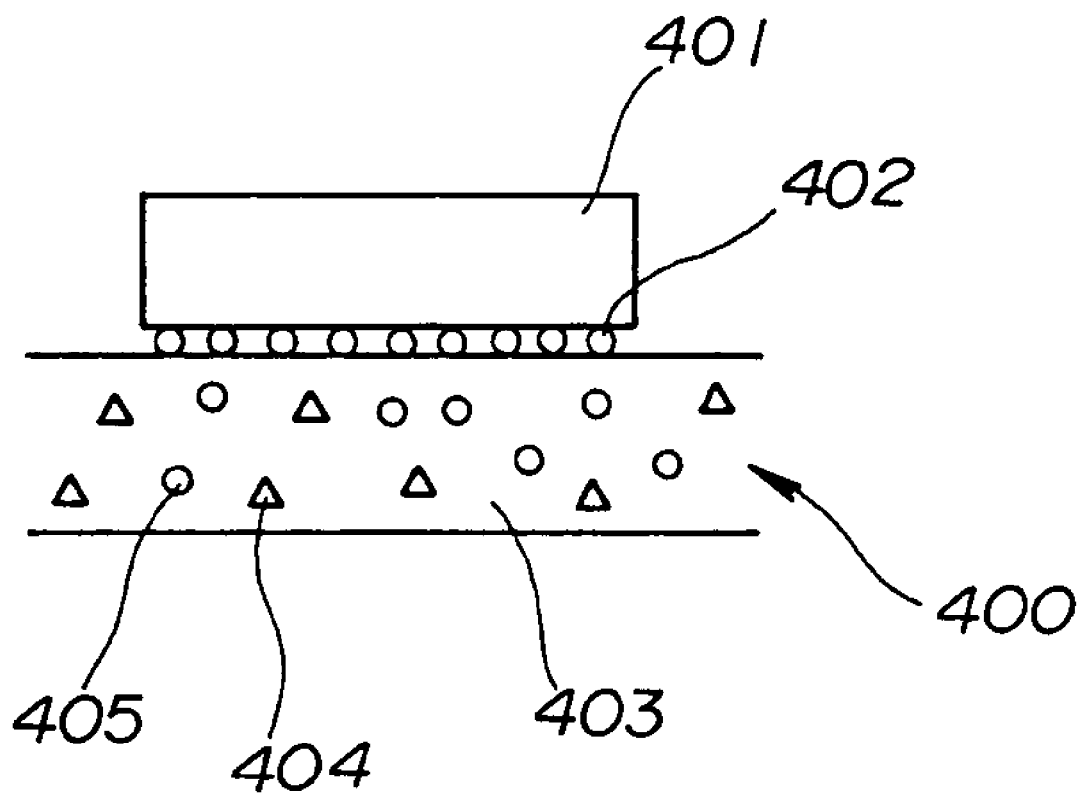
FIG. 16 is a diagram showing a state in which a material that adjusts the coefficient of thermal expansion has been mixed into the front-and-back electrically conductive substrate.

FIG. 16 is a diagram showing a state in which a material that adjusts the coefficient of thermal expansion has been mixed into the front-and-back electrically conductive substrate.

As shown in the diagram, a semiconductor component 401 is mounted on the fourth front-and-back electrically conductive substrate 400 via a solder or gold metal bump 402. Particularly with bare chip semiconductor components 401, the circuit is formed directly on the silicon base, so the coefficient of thermal expansion differs from that of the epoxy or polyimide front-and-back electrically conductive substrate. The stress caused by this difference concentrates at the joint between the metal bump and the pad and can cause the pad to peel or crack, degrading the reliability of the connection.

In order to avoid this disadvantage, silicon oxide 404 and aluminum oxide 405 are mixed into the resin insulation that forms the fourth front-and-back electrically conductive substrate 400. By so doing, the coefficient of thermal expansion of the silicon can be brought into closer approximation to that of the front-and-back electrically conductive substrate, thus making it possible to avoid malfunctions attendant upon a sharp difference in the coefficient of thermal expansion.

It should be noted that either or both the silicon oxide 404 and aluminum oxide 405 may be mixed into the resin insulation. Moreover, in addition to serving the function of adjusting the coefficient of thermal expansion, the silicon oxide 404 and the aluminum oxide 405 also serve the function of adjusting the viscosity of the resin insulation.

The above description is provided in order to enable any person skilled in the art to make and use the invention and sets forth the best mode contemplated by the inventor of carrying out the invention.

The present invention is not limited to the specifically disclosed embodiments, and variations and modifications may be made without departing from the scope and spirit of the present invention.

The present application is based on Japanese Priority Application No. 2000-226269, filed on Jul. 27, 2000, the contents of which are hereby incorporated by reference.

What is claimed is:

1. A method for manufacturing a front-and-back electrically conductive substrate, the method comprising the steps of:
    preparing a wafer made of a single material having a thickness greater than a height of a plurality of posts to be formed;
    forming, by a process of anisotropic etching, the plurality of posts having an electrically conductive portion;
    filling space between the plurality of posts with an insulating material, thereby obtaining a composite substrate having a first surface and a second surface; and
    polishing the first surface and second surface to obtain the front-and-back electrically conductive substrate, wherein the first surface and second surface are electrically connected by the plurality of posts.

2. The method for manufacturing the front-and-back electrically conductive substrate as claimed in claim 1, wherein the anisotropic etching process leaves a portion of the etching material disposed so as to couple the plurality of posts to each other.

3. A method for manufacturing a front-and-back electrically conductive substrate, the method comprising the steps of:
    performing a process of anisotropic etching to a wafer so as to leave a plurality of posts;
    filing space between the plurality of posts with an insulting material, thereby obtaining a composite substrate having a first surface and a second surface; and
    polishing the first surface and second surface to obtain the front-and-back electrically conductive substrate, wherein the first surface and second surface are electrically connected by the plurality of posts.

4. A method for manufacturing a front-and-back electrically conductive substrate, the method comprising the steps of:
    Forming, by a process of anisotropic etching, a plurality of posts;
    covering the plurality of posts with an eclectically conductive layer;
    filing space between the plurality of posts with an insulting material, thereby obtaining a composite substrate having a first surface and a second surface; and
    polishing the first surface and second surface to obtain the front-and-back electrically conductive substrate, wherein the first surface and second surface are electrically connected by the plurality of posts.

* * * * *